United States Patent [19]
Campardo et al.

[11] Patent Number: 6,060,753
[45] Date of Patent: May 9, 2000

[54] LOW NOISE OUTPUT BUFFER FOR SEMICONDUCTOR ELECTRONIC CIRCUITS

[75] Inventors: Giovanni Campardo, Bergamo; Stefano Zanardi, Seriate; Maurizio Branchetti, San Polo D'Enza, all of Italy

[73] Assignee: SGS-Thomson Microelectronics S.r.l., Agrate Brianza, Italy

[21] Appl. No.: 08/889,653

[22] Filed: Jul. 8, 1997

[30]      Foreign Application Priority Data

Jul. 31, 1996 [EP]   European Pat. Off. ............. 96830430

[51] Int. Cl.$^7$ ..................................................... H01L 29/76
[52] U.S. Cl. ............................ 257/369; 257/362; 326/27; 326/83
[58] Field of Search .................................. 257/361, 362, 257/369; 326/26, 27, 83, 86

[56]                 References Cited
              FOREIGN PATENT DOCUMENTS 0 614 222   9/1994   European Pat. Off. ........ H01L 27/09

OTHER PUBLICATIONS

European Search Report from European Patent Application 96830430.3, filed Jul. 31, 1996.

*Primary Examiner*—Mahshid Saadat
*Assistant Examiner*—George C. Eckert, II
*Attorney, Agent, or Firm*—Wolf, Greenfield & Sacks, P.C.; James H. Morris; Theodore E. Galanthay

[57]                ABSTRACT

A low-noise output stage for an electronic circuit integrated on a semiconductor substrate is disclosed. The low-noise output stage comprises a complementary CMOS transistor pair including a P-channel pull-up transistor and an N-channel pull-down transistor, connected across a first terminal of the electronic circuit to receive a supply voltage, and a second terminal of the electronic circuit to receive a second reference potential. The transistors are connected together to form an output terminal of the electronic circuit for connection to an external load. The pull-down transistor is formed in a three-well structure to prevent propagation of a discharge current from the external load through the semiconductor substrate.

14 Claims, 6 Drawing Sheets

6,060,753

LOW NOISE OUTPUT BUFFER FOR SEMICONDUCTOR ELECTRONIC CIRCUITS

BACKGROUND OF THE INVENTION

1. Field of the Invention

This invention relates to a low-noise output stage for semiconductor electronic circuits.

More particularly, though not solely, the invention concerns an output stage of the type which comprises a complementary CMOS transistor pair, including a P-channel pull-up transistor and an N-channel pull-down transistor, connected between a first terminal, receiving a supply voltage, of a circuit and a second terminal of the circuit which is held at a second reference potential, said transistors being connected to each other to provide an output terminal for connection to an external load.

2. Discussion of the Related Art

As is well known, electronic circuits which are monolithically integrated on a semiconductor, or chips, are assembled into a package which comprises a case formed from a thermosetting resin and having a lead frame embedded therein for supporting electric connection pins, the electronic circuit having been bonded to the lead frame.

These pins are allowed to project outwards from the resin case, and are bent to form a set of comb-like connectors for plugging into a printed circuit board, for example. On the case inside, the terminals or pads of the electronic circuit are connected to the inner ends of the pins by small interconnection wires, referred to as the bonding wires.

The accompanying FIG. 1 shows, by way of example, a schematic view of a semiconductor chip having terminals A, B, C and D for connection to respective external supply pins.

Terminals A and B are intended for receiving a supply voltage, while terminals C and D are intended for ground connection. Also shown in FIG. 1 are the inner end portions of a first pin H on which a first supply voltage reference Vdd is received and a second pin K on which a second supply reference, such as a signal ground, is received.

Respective connections are provided between the terminals A, B and the pin H which are formed of bonding wires; like connections are provided between the terminals C, D and the pin K.

The bonding wires have an inherent inductance, denoted by L. The dual connections between the terminals A, B and the pin H, or between the terminals C, D and the pin K, are shown in FIGS. 1A and 1B, respectively.

The inductance value between terminals at the same potential and their corresponding pins H or K, is given by the ratio L/2. More generally, calling N the number of the connections made between a given set of terminals at the same potential and one pin, the overall inductance of the bond will be L/N, representing the value of N inductance L in parallel.

The above explanation has been given to introduce the problems which are encountered when an output stage of an electronic circuit is required to change its logic output value.

This is the case, for example, with electronic memory circuits that have a circuit portion for reading the contents of the memory cells. Incorporated within this circuit portion are output stages arranged to change their logic states in order to output the contents of the memory cells.

Many electronic circuits of this type have output stages which incorporate a complementary pair of transistors, e.g. a P-channel MOS pull-up transistor connected to an N-channel MOS pull-down transistor.

This complementary pair forms essentially a CMOS inverter which is connected and powered across the terminal A, at the supply voltage Vdd, and the terminal D, at ground potential.

The circuit interconnection node between the transistors of the complementary pair forms the stage output U. An external load Cload of the capacitive type is usually connected to the output U and is charged or discharged as the voltage at the output stage is switched.

The external load is normally of at least a hundred picoFarads, and for it to be charged or discharged within a reasonable length of time, on the order of tens of nanoseconds, the output stage must be able to supply a relatively large current, e.g. a current of 10 to 15 mA.

During the switching step, either the pull-up or the pull-down transistor will be turned on, resulting in a voltage drop across the bonding wires between the electronic circuit terminal, A or D, and the corresponding one of the pins.

In essence, the nodes A and B "shift" in voltage during normal operation of the circuit; that is, the internal supply voltage Vdd will decrease and the internal ground increase.

The voltage drop causing these variations is tied to the inductance value of the bonding wires by the following relationship:

$$v=L*(di/dt).$$

Where N output stages are switched simultaneously, e.g. with N=8 for an eight-bit memory circuit or N=16 for a sixteen-bit memory circuit, the above relationship changes to:

$$v=N*L*(di/dt),$$

which can be re-written as follows:

$$\Delta V=N*L*\Delta I.$$

FIG. 2 shows a voltage vs. time plot which illustrates the behaviour of the ground terminal D during the initial simultaneous turning on of eight output stages.

The discharge current of the pull-down transistor causes the voltage at the ground terminal D to rise. A corresponding voltage rise is also induced on the terminal C, which is in turn connected to the pin K but also connected to the terminal D inside the output stage.

Specifically, with reference to the accompanying FIG. 3, it can be seen that the terminals C and D are connected to each other within the circuit by:

a resistance Rsub of the semiconductor substrate P; and a pair of resistances Rring contributed by the bias rings of the NMOS transistor of the input stage and the transistor Nu of the output stage, respectively.

Through a series of these three resistances, the discharge current of the capacitive external load Cload is passed to the terminal C of the internal ground GNDcore.

Assuming that the input S of the output stage is applied a signal at a logic high, the pull-up transistor will be turned off, and the pull-down transistor turned on. Under this condition, the potential at the terminal D will rise due to the discharge current Idis of the network RLC formed of the resistive, inductive, and capacitive components of the bonding wires.

Such a situation, depicted schematically in FIG. 4, may be a cause of false readings in a memory circuit and the generation of an unwanted ATD (Address Transient Detection) signal that will enable a fresh unwanted reading from the memory cells.

If a fresh reading is enabled, either of two different situations may arise, dependent on the memory address that has been input at the time the switching takes place.

Where the memory address is unchanged, merely a delay would appear in the memory access time; but where the memory address has changed, a fresh cell would be read undesirably.

The underlying technical problem of this invention is to provide a low-noise output stage which has such constructional and functional features as to remove any risk of false readings following a changeover.

This allows the limitations and drawbacks of the output stages for electronic memory circuits according to the prior art to be overcome.

SUMMARY OF THE INVENTION

In one embodiment of the present invention, a low-noise output stage for an electronic circuit integrated on a semiconductor substrate is provided. The low-noise output stage includes an output terminal connected to an external load, a complementary CMOS transistor pair, including a P-channel pull-up transistor and an N-channel pull-down transistor. The P-channel pull-up transistor is coupled between a first terminal and the output terminal and the N-channel pull-down transistor is coupled between the output terminal and a second terminal. The pull-down transistor is formed in a three-well structure to prevent propagation of a discharge current from the external load through the semiconductor substrate.

In another embodiment of the present invention, a low-noise output stage for an electronic circuit integrated on a semiconductor substrate is provided. The low-noise output stage includes first and second nodes to receive a reference potential, an output node to connect to an external load, a complementary transistor pair including a pull-up transistor and a pull-down transistor. The pull-down transistor is formed within a plurality of wells to prevent propagation of a discharge current from the external load through the semiconductor substrate.

In another embodiment of the present invention, an electronic circuit semiconductor substrate is provided. The electronic circuit includes an input stage to receive an input signal, an output stage to provide an output signal to an external load, and means for preventing propagation of a discharge current from the external load to the input stage through the semiconductor substrate.

Another embodiment of the present invention is directed to a method for isolating an input stage from an output stage in an electronic integrated circuit. The method includes steps of forming the input stage and the output stage with any common semiconductor substrate, and forming the output stage within a multi-well structure to prevent propagation of a discharge current from an external load through the semiconductor substrate.

In yet another embodiment of the present invention, an electronic circuit integrated on a semiconductor substrate is provided. The electronic circuit includes an input stage to receive an input signal and an output stage to provide an output signal to an external load. The output stage includes first and second nodes to receive a reference potential, an output node to connect to the external load, and a complementary transistor pair including a pull-up transistor and a pull-down transistor. The pull-down transistor is formed within a plurality of wells to prevent propagation of a discharge current from the external load through the semiconductor substrate to the input stage.

BRIEF DESCRIPTION OF THE DRAWINGS

The features and advantages of a stage according to this invention will be apparent from the following description of an embodiment thereof, given by way of non limiting example with reference to the accompanying drawings.

DETAILED DESCRIPTION

Figure 5:
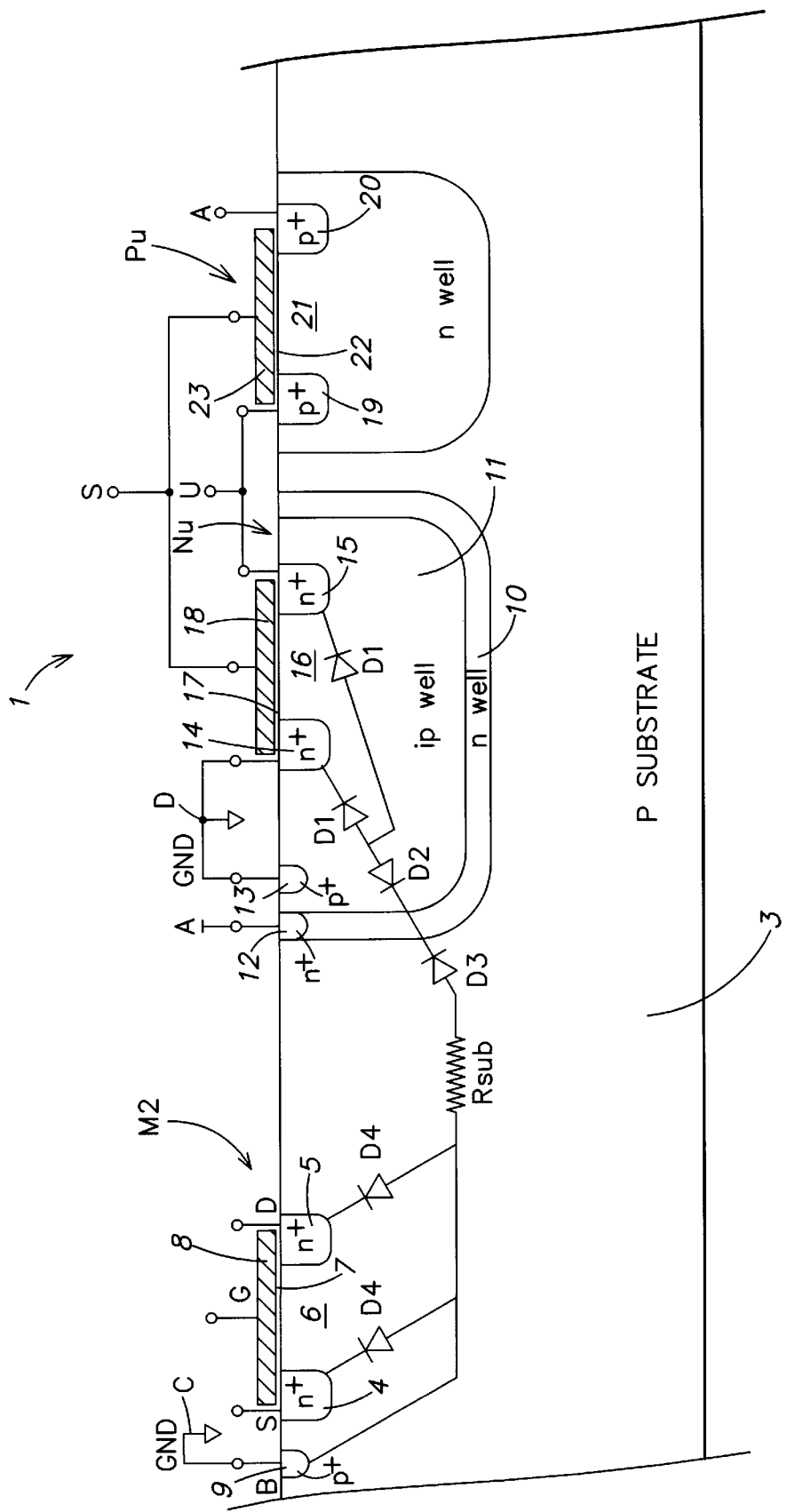
FIG. 5 is a vertical section view, drawn to an enlarged scale, showing schematically the construction of an output stage according to the invention which has been formed on a semiconductor substrate with three-well technology.

Referring to the drawing figures, and in particular to FIG. 5, generally and schematically shown at 1 is a final output stage in accordance with one embodiment of the present invention which is intended for an electronic circuit 2 integrated on a semiconductor.

Figure 1:
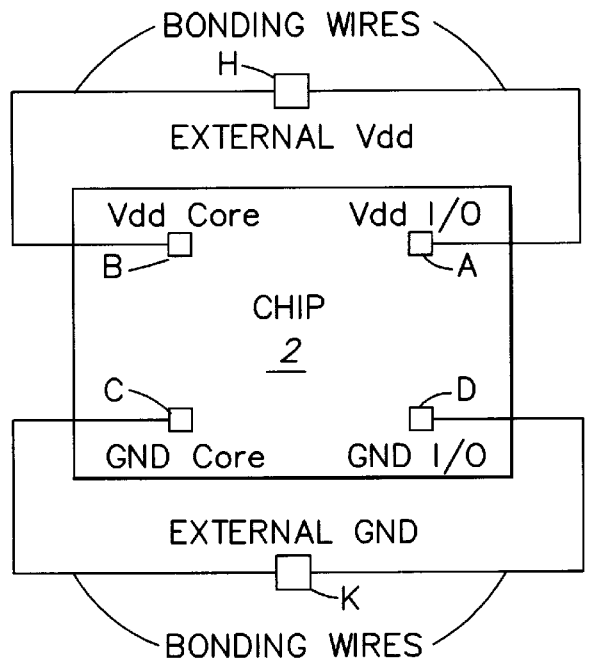
FIG. 1 shows in diagrammatic form an electronic circuit and its connections to external electric connection pins.
Figure 1A:
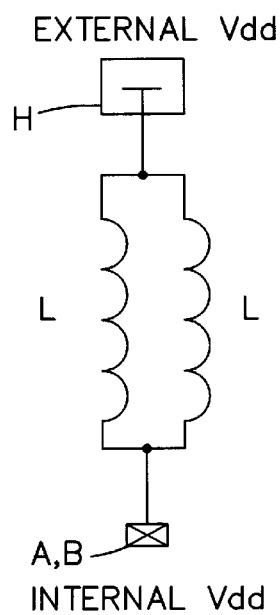
FIGS. 1A and 1B are diagrammatic views of some details of the connections in FIG. 1.
Figure 1B:
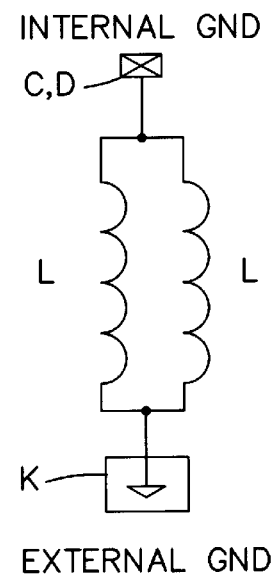
Figure 2:
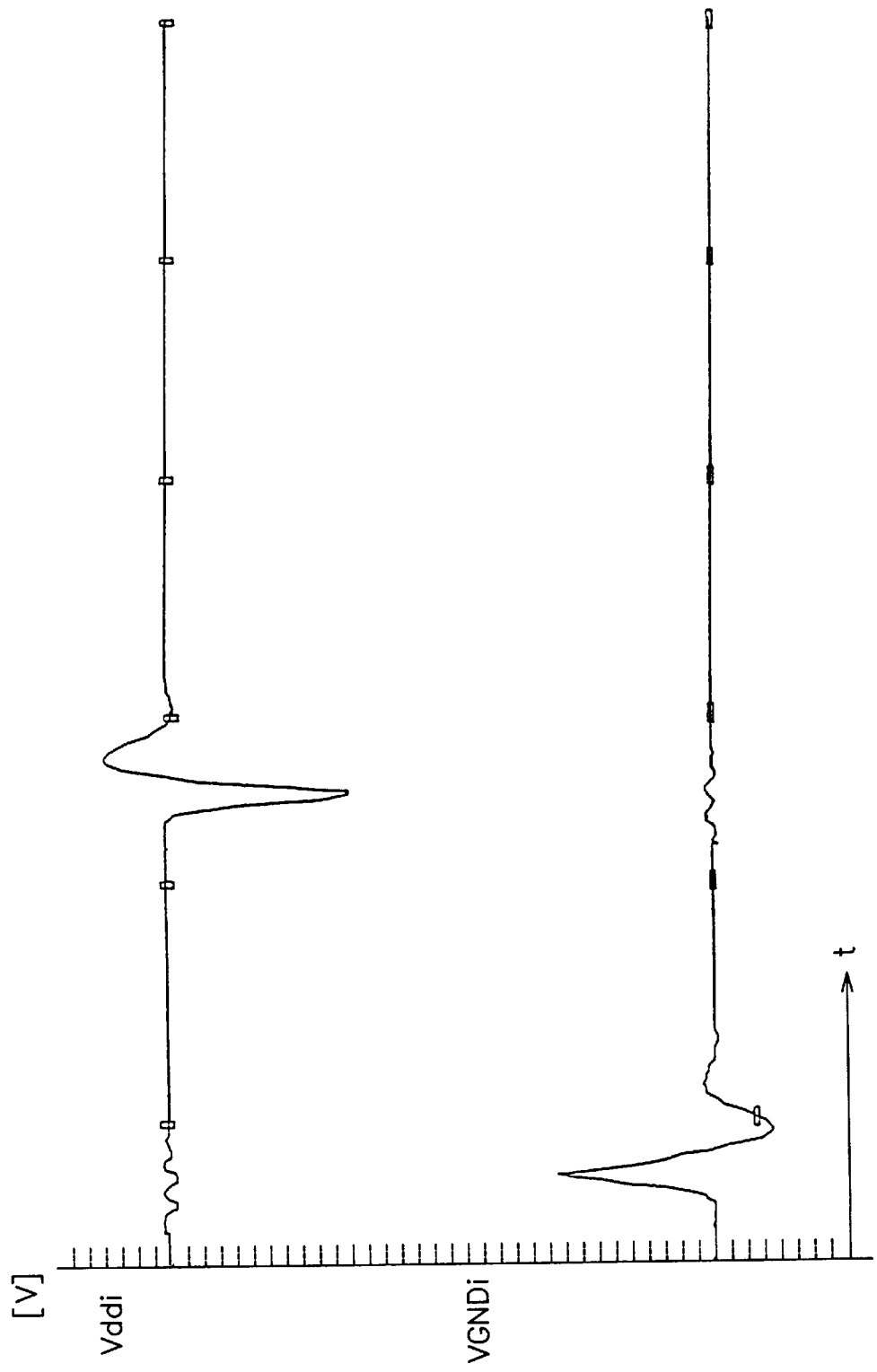
FIG. 2 is a general plot vs. time of the voltage value at a terminal of the circuit in FIG. 1.
Figure 3:
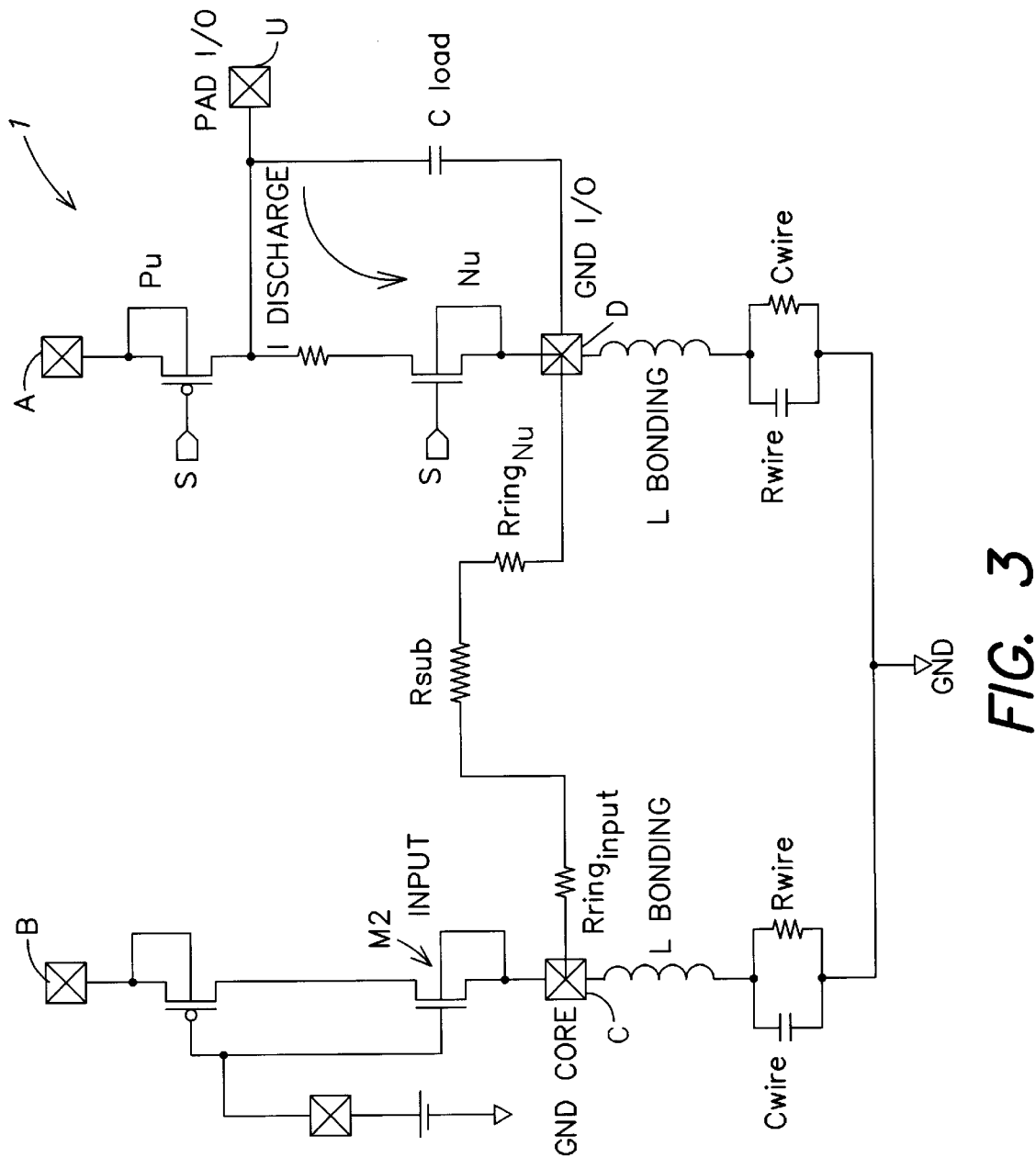
FIG. 3 shows in diagrammatic form a detail of the circuit in FIG. 1 at a predetermined stage of its operation.
Figure 4:
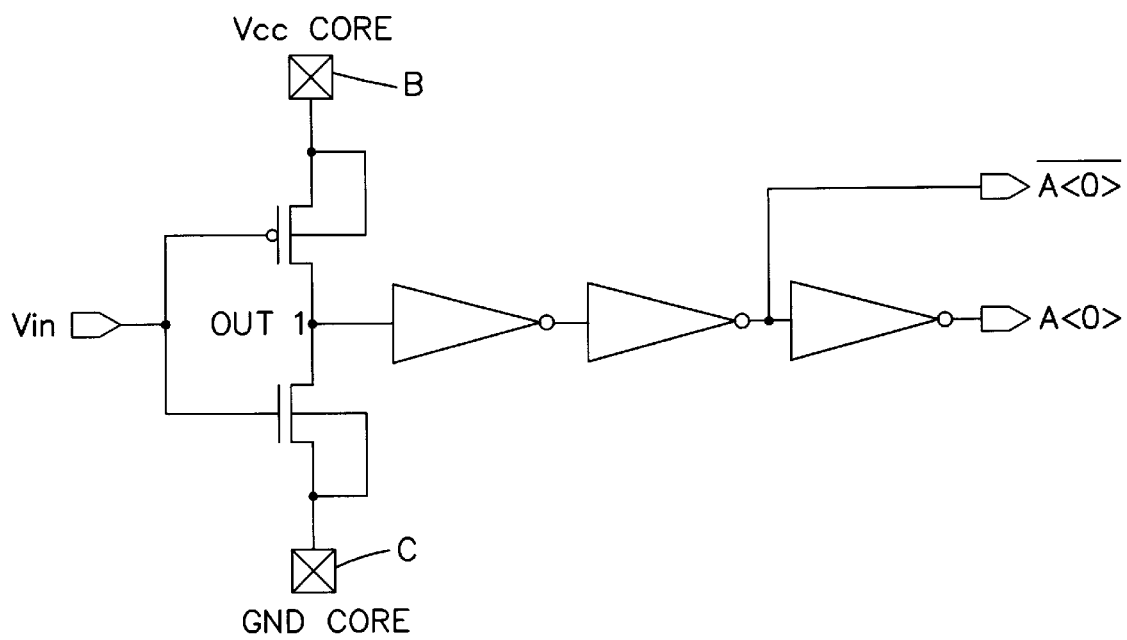
FIG. 4 is another diagrammatic view of the detail shown in FIG. 3.

The circuit 2 is shown schematically in FIG. 1 and is representative of one of a number of devices such as a storage device, a read circuit, or some other device or circuit that has at least one pair of terminals A and B adapted to receive a first internal supply voltage potential $Vdd_i$, and at least one pair of terminals or pads C and D adapted to receive a second potential, such as an internal signal ground $GND_i$.

The output stage 1 comprises a complementary CMOS transistor pair formed of a first transistor Pu of the P-channel pull-up type which is connected in series to a second transistor Nu of the N-channel pull-down type. Both transistors Pu and Nu are connected between a first supply voltage reference Vdd and a second ground reference, corresponding essentially to the terminals A and D.

The connection point between the transistors Pu and Nu corresponds to the output terminal U of the stage 1.

The transistors Pu and Nu are formed on a common P-doped semiconductor substrate 3, but in respective P and N wells, to be described.

The other transistors of the electronic circuit 2 are also formed on the substrate 3: in particular, the N-channel pull-down transistors of an input buffer connected, for example, across the terminals B and C.

More particularly, an N-channel transistor M2 of the input buffer is formed directly on the surface of the substrate 3 with respective source and drain regions 4 and 5 which are doped N+.

The channel region 6 of the transistor M2 is defined and bounded between the regions 4 and 5. A thin oxide layer 7 is formed over this channel region 6 to isolate the channel from a gate region 8 made of polycrystalline silicon, for example.

Also provided is a contact region 9, which is formed with P+ doping in the substrate 3 to allow the substrate 3 to be connected to ground through the terminal C.

Advantageously, the pull-down transistor Nu of the complementary CMOS pair in the stage 1 is formed, according to the invention, within a three-well structure.

More particularly, a first N well 10 is formed, on one side of the transistor M2, which accommodates a second IP well 11 delimiting a smaller volume than the first.

Formed between the first and the second well on the substrate surface is a contact region 12 of the N+ type. This region 12 is applied the supply voltage Vdd through the terminal A.

A second contact region 13, of the P+ type, is formed in the well 11 for application of the ground potential through the terminal D.

Advantageously, the pull-down transistor Nu is formed inside the second IP well 11. This transistor has source and drain regions 14 and 15 bounding a channel region 16.

A gate region 18 is formed over the channel 16 and isolated by a thin oxide layer 17.

The pull-up transistor Pu of the stage 1 is formed in a respective N well adjacent to the well 10. This transistor Pu has drain and source regions 19 and 20 of the P+ type which bound a channel region 21 of the P type.

A gate region 23 overlies the channel 21 and is isolated by a thin oxide layer 22.

The resulting structure as shown in FIG. 5 highlights the fact that the pull-down transistor is a three-well design.

This means that there will be a first junction between the source and drain regions 14, 15 and the IP well 11. This junction is represented schematically by a diode D1.

A second junction is defined between the IP well 11 and the N well 10. A diode D2 represents schematically this junction.

A third junction is between the well 10 and the substrate 3. This junction also is represented schematically by a diode D3.

It should be noted that the diodes D1 and D2 are connected to each other, but oppositely biased from each other. The diodes D2 and D3 also are connected to each other in opposed bias, relationship, so that the discharge current of the external load cannot propagate through the substrate.

Figure 6:
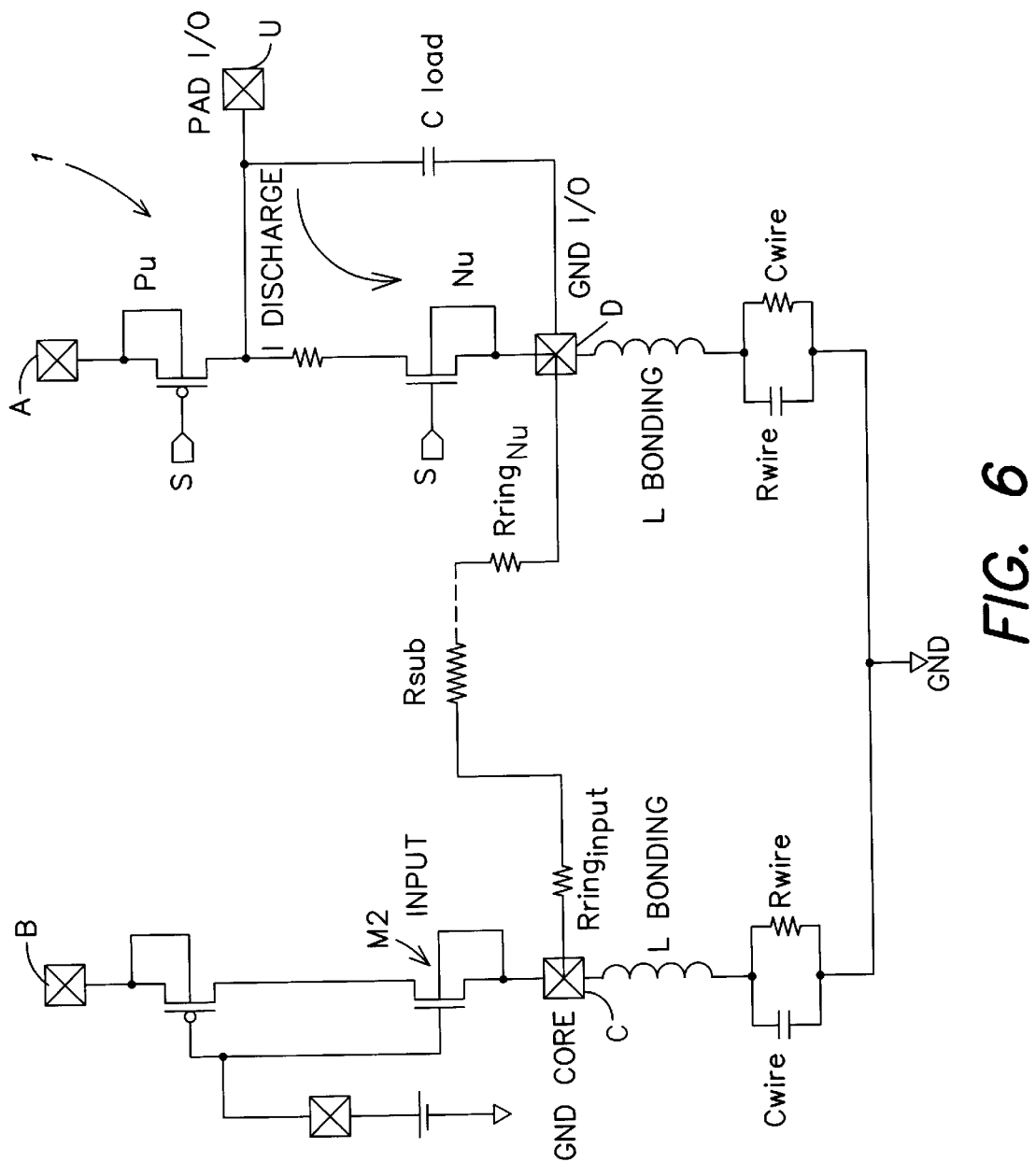
FIG. 6 shows in diagrammatic form a detail of the inventive output stage at a predetermined stage of its operation.

The resulting structure of the output stage of this invention is shown in FIG. 6, where the break in the connection between the substrate resistance and that of the well is clearly visible.

In this way, voltage variations at the ground terminal D of the output buffer will no longer reflect on the internal ground terminal C of the input buffer, as illustrated by the small graph attached to the two terminals.

Thus, the output stage structure of this invention allows the ground terminals C and D to be isolated from each other. The potential at these terminals is only impressed by the pins outside the circuit, and cannot be altered by any conduction path within the electronic circuit or the output stage.

Having thus described at least one illustrative embodiment of the invention, various alterations, modifications and improvements will readily occur to those skilled in the art. Such alterations, modifications and improvements are intended to be within the scope and spirit of the invention. Accordingly, the foregoing description is by way of example only, and it is not intended as limiting. The invention's limit is defined only in the following claims and the equivalent thereto.

What is claimed is:

1. A low-noise output stage for an electronic circuit integrated on a semiconductor substrate having a first terminal for connecting to a first reference potential and a second terminal for connecting to a second reference potential, the low noise output stage comprising:

an output terminal to connect to an external load;

a CMOS transistor pair including a P-channel pull-up transistor and an N-channel pull-down transistor, the P-channel pull-up transistor being coupled between the first terminal and the output terminal and the N-channel pull-down transistor being coupled between the output terminal and the second terminal; and wherein the pull-down transistor is formed in a three-well structure to prevent propagation of a discharge current from the external load through the semiconductor substrate;

wherein a first contact region of an N+ type for connecting to the first terminal is formed between the first and second wells on a surface of the substrate.

2. The low-noise output stage of claim 1, wherein the N-channel pull-down transistor is formed inside a first well having a doping substantially the same as a doping of the substrate, the first well being located within a second well having a doping opposite that of the first well.

3. The low noise output stage of claim 2, wherein the P-channel pull-up transistor is formed within an N well adjacent to said second well.

4. The low noise output stage of claim 1, wherein the P-channel pull-up transistor and the N-channel pull-down transistor are formed on a common P-doped semiconductor substrate within respective P and N wells.

5. The low noise output stage of claim 1, wherein a second contact region of a P+ type for connecting to the second terminal is formed in the first well on the surface of the substrate.

6. The low noise output stage of claim 5, wherein said second contact region receives the second reference potential from a pin outside the stage and the second reference potential is not substantially altered by a conduction path within the stage.

7. A low-noise output stage for an electronic circuit integrated on a semiconductor substrate, the low noise output stage comprising:

first and second nodes to receive a reference potential;

an output node to connect to an external load;

a complementary transistor pair including a pull-up transistor and a pull-down transistor, the pull-up transistor being coupled between the first node and the output node and the pull-down transistor being coupled between the output node and the second node; and wherein the pull-down transistor is formed within a plurality of wells to prevent propagation of a discharge current from the external load through the semiconductor substrate;

wherein a first contact region of an N+ type for connecting to the first node is formed between the first and second wells on a surface of the substrate.

8. The low-noise output stage of claim 7, wherein the pull-down transistor is formed inside a first well having a doping substantially the same as a doping of the substrate, the first well being located within a second well having a doping opposite that of the first well.

9. The low noise output stage of claim 8, wherein the pull-up transistor is a P-channel transistor, the pull-down transistor is an N-channel transistor, and the P-channel transistor and the N channel transistor are formed on a common P-doped semiconductor substrate within respective P and N wells.

10. The low noise output stage of claim 9, wherein the P-channel transistor is formed within an N well adjacent to said second well.

11. The low noise output stage of claim 7, wherein a second contact region of a P+ type for connecting to the second node is formed in the first well on the surface of the substrate.

12. The low noise output stage of claim 7, wherein the pull-up transistor is a P-channel transistor, the pull-down transistor is an N-channel transistor, and the P-channel transistor and the N channel transistor are formed on a common P-doped semiconductor substrate within respective P and N wells.

13. The low noise output stage of claim 7, wherein the P-channel transistor is formed within an N well adjacent to said second well.

14. A low-noise output stage for an electronic circuit integrated on a semiconductor substrate, the low noise output stage comprising:

first and second nodes to receive a reference potential;

an output node to connect to an external load;

a complementary transistor pair including a pull-up transistor and a pull-down transistor, the pull-up transistor being coupled between the first node and the output node and the pull-down transistor being coupled between the output node and the second node; and wherein the pull-down transistor is formed within a plurality of wells to prevent propagation of a discharge current from the external load through the semiconductor substrate;

wherein the P-channel transistor is formed within an N well adjacent to said second well; and wherein a first contact region of an N+ type for connecting to the first node is formed between the first and second wells on a surface of the substrate.

* * * * *